United States Patent
Camp, Jr.

(10) Patent No.: US 6,380,809 B1
(45) Date of Patent: Apr. 30, 2002

(54) METHOD AND APPARATUS FOR TUNING OSCILLATOR TO A SELECTED FREQUENCY

(75) Inventor: William O. Camp, Jr., Chapel Hill, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/507,392

(22) Filed: Feb. 18, 2000

(51) Int. Cl.[7] ................................................. H03L 7/00
(52) U.S. Cl. ...................... 331/17; 455/260; 455/226.1; 455/226.2
(58) Field of Search ............................... 455/260, 434, 455/180.3, 186.1, 256, 265, 264, 257, 258; 331/17, 2

(56) References Cited

U.S. PATENT DOCUMENTS 4,410,860 A * 10/1983 Kipp et al. ................. 331/1 A
6,157,260 A * 12/2000 Tilley et al. .................... 331/2

* cited by examiner

*Primary Examiner*—Arnold Kinkead
(74) *Attorney, Agent, or Firm*—Coats & Bennett, PLLC

(57) ABSTRACT

The present invention discloses an apparatus and method for tuning an oscillator to a selected frequency during power measurements of a neighbor list. In response to a received request for the oscillator to tune to a selected frequency, a controller associated with a switch determines whether the request comprises a first request for the oscillator to tune to the selected frequency. If so, the switch is placed in a first position, and the oscillator is provided a voltage control signal from a phase locked loop. The voltage control signal applied to the input of the oscillator is also saved at a location associated with the selected frequency. If the controller determines that the request does not comprise a first request for the selected frequency, a previously saved voltage control signal associated with the selected frequency is applied to the input of the oscillator by placing the switch in a second position. In either case, the oscillator is tuned to the selected frequency responsive to the applied voltage control signal.

21 Claims, 5 Drawing Sheets

METHOD AND APPARATUS FOR TUNING OSCILLATOR TO A SELECTED FREQUENCY

BACKGROUND OF THE INVENTION

1. Technical Field of the Invention

The present invention relates to tuning of a local oscillator, and more particularly, to a method for increasing the speed with which a local oscillator tunes to a predetermined frequency in order to more quickly step through a set of power measurements on a number of neighbor list stations.

2. Description of Related Art

Within a digital mobile station, there is a need to be able to adjust the local oscillator to a predetermined frequency as quickly as possible when stepping through a set of power measurements on neighbor list stations. By quickly stepping through the frequencies on which power measurements are made the mobile station hardware may be turned off for longer periods of time once the power measurements are completed. This saves battery charge and provides longer operating periods for a mobile station operating solely on battery power.

A conventional, prior art mobile station 10 is shown in FIG. 1. The mobile station 10 includes a controller 12 which controls the functions of the mobile station 10. The controller 12 typically includes a central processing unit (CPU) (not shown), memory (not shown), and I/O ports (not shown). The controller 12 processes voice or data signals to and from a transceiver 14. The transceiver 14 converts a voice or data signal from the controller 12 to a radio wave and also detects and demodulates a received radio wave into a voice or data signal. The transceiver 14 is connected to an antenna 16 for transmission and reception of radio waves.

The controller 12 is also connected to a microphone 18, speaker 20 and user interface 22. The microphone 18 includes a dynamic microphone, condenser microphone, or the like, to transduce a user's voice into an electrical signal. An analog to digital converter (ADC) (not shown) converts the electrical signal into a digital voice signal. The speaker 20 outputs a received voice signal, and typically includes a digital-to-analog converter (DAC) (not shown) and amplifier (not shown). The user interface 22 includes a display, such as an LED or LCD, and a keypad or other controls. A rechargeable battery 24 provides power to the mobile station 10.

A synthesizer 26 is connected to the controller 12 and transceiver 14. The synthesizer 26 generates signals at variable frequencies in response to an input frequency value from the controller 12. The generated signals are communicated to the transceiver 14 for reception or transmission of a channel about that frequency. The synthesizer 26 includes a phase detector 28, loop filter 30, and voltage controlled oscillator (VCO) 32. A reference crystal 34 is connected to the synthesizer 26 and generates a reference signal 35 at a set frequency $f_r$. The controller 12 controls the frequency output of the synthesizer 26 by transmitting a channel data signal 11 to the synthesizer 26 to store a divisor N value in a Divide-by-N Register 36. The controller 12 then transmits a control signal 13 to the synthesizer 26 to latch the divisor N value. In response, a frequency $f_o$ of output signal 33 from the VCO 32 is divided by N. The phase detector 28 compares the phases of the output signal 37 of the Divide-by-N Register 36 and the reference signal 35 from reference crystal 34 to generate an error voltage ($V_e$) signal 29 proportional to the phase difference between the two signals.

The loop filter 30 is a low pass filter that filters the voltage error $V_e$, signal 29 prior to inputting the signal to the VCO 32. The frequency $f_o$ of the output signal 33 of the VCO 32 stabilizes to $f_o=N*f_r$ and is transmitted to the transceiver 14.

The conventional operation of the mobile station 10 of FIG. 1 during a measurement operation of a set of channels is now described. The mobile station 10 receives a measurement order or a neighbor cell list from the radio base station 4 over a traffic or control channel. The controller 12 waits until the next idle state to perform measurements of the channels designated. During the next idle period, the controller 12 determines the number of channels to measure. The controller 12 stores data for the first channel to be measured in the Divide-by-N Register 36 of the synthesizer 26 and transmits a "latch new channel data" signal 13 to the synthesizer 26. In response, the synthesizer 26 generates a VCO output signal 33 at a frequency $f_o$ specified by the channel data in the Divide-by-N Register 36. The VCO output signal 33 is communicated to the transceiver 14 which then receives a measurement command 15 from the controller 12. The transceiver 14 measures the signal strength of the first channel and transmits a measured signal strength data signal 17 to the controller 12.

The controller 12 receives the measured signal strength data and decrements the number of channels to measure. The controller 12 determines if additional channels are to be measured. If no more channels are to be measured, the controller 12 again enters an idle period and is ready to transmit or receive on a traffic channel or an active state. Otherwise, the controller 12 loads the channel data for the next channel to be measured into the synthesizer 26. If there is not sufficient time to complete the measurements during the idle period between transmitting or receiving, the mobile station 10 must wait until the next idle period to continue the measurements.

The power measuring operation in a mobile station needs to be performed quickly and efficiently, especially when a mobile station is measuring channels during an idle period, since there is limited time to perform the operation. The process normally taking up the greatest amount of time is the tuning of the local oscillator 32 to the frequency being measured. A need has thus arisen in the industry for a more efficient manner for tuning an oscillator to enable faster measurement of varying sets of channels in a neighbor list by a mobile station.

One solution involves the use of so-called speedup mechanisms within the phase locked loop of the mobile station. These mechanisms push additional charge current into the phase locked loop in an effort to more quickly adjust the frequency of the oscillator. However, this method has an inherent limit on how fast the frequency can change before effects of changing the loop gain cause longer settling transients within the phase locked loop. Thus, an improved method for more quickly tuning a local oscillator signal to a desired frequency in order to more rapidly step through power measurements for neighbor list of mobile stations is needed.

SUMMARY OF THE INVENTION

The present invention overcomes the foregoing and other problems with a method and apparatus for more quickly tuning an oscillator to a selected frequency within a mobile station during power measurements. A switch, controller and associated analog to digital and digital to analog converters are located between an output of a phase locked loop and the voltage control input of a local oscillator. The phase locked loop consists of all the parts of the synthesizer and reference crystal less the voltage controlled oscillator. The switch has a first and second positions. In the first position, the output of the phase locked loop is passed directly to the voltage control input of the local oscillator. In the second position, an output from the controller, via a digital to analog converter, is provided to the voltage control input of the local oscillator.

In response to a request to perform power measurements on frequencies for members of a neighbor list within a mobile station, an initial determination is made by the controller as to whether the local oscillator has previously tuned to the requested frequency. If not, the switch is place in the first position such that the voltage control signal applied to the local oscillator comes from the phase locked loop. During this time, the applied voltage control signal from the phase locked loop is converted from analog to digital format and stored in a memory associated with the controller at a location associated with the desired frequency.

If the controller determines that the local oscillator has previously tuned to the requested frequency during power measurements, the controller instructs the switch to the second position and a digital voltage control value associated with the requested frequency is retrieved from the memory of the controller. The retrieved value is applied to a digital to analog converter, and the converted analog voltage control signal is applied to the input of the local oscillator via the switch.

BRIEF DESCRIPTION OF THE DRAWINGS

A more complete understanding of the method and apparatus of the present invention may be obtained by reference to the following Detailed Description when taken in conjunction with the accompanying Drawings wherein.

DETAILED DESCRIPTION

Figure 1:
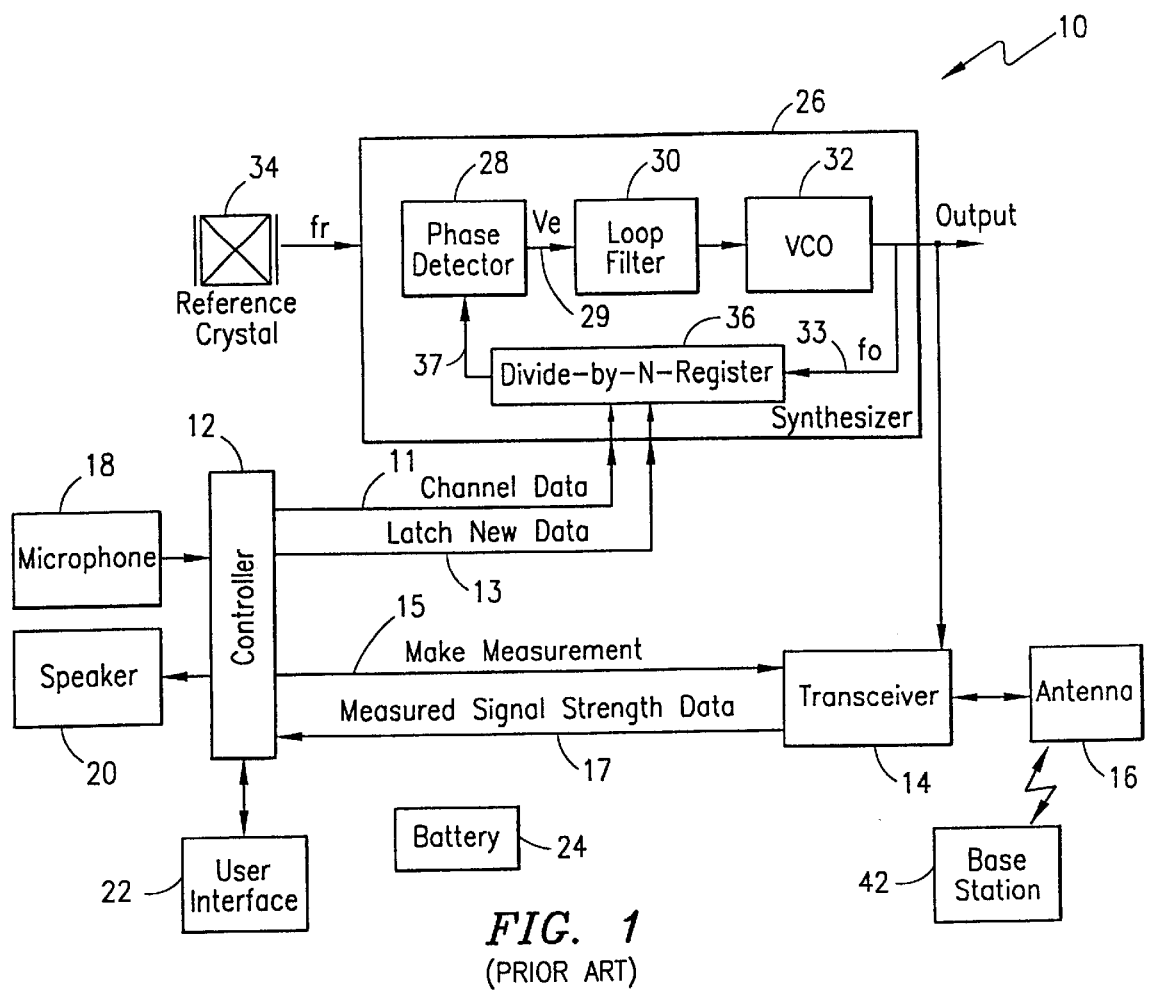
FIG. 1 is a block diagram of a conventional mobile station.
Figure 2:
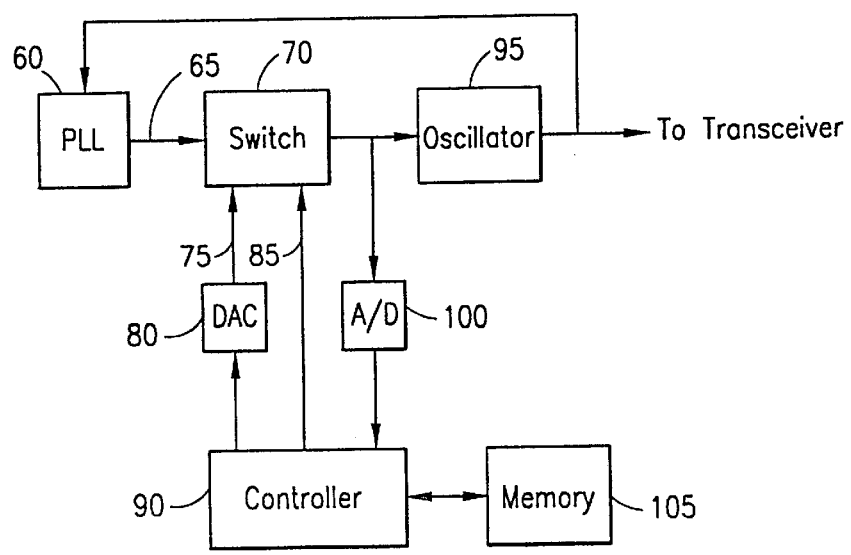
FIG. 2 is a block diagram illustrating the circuitry of the present invention.

Referring now to the drawings, and more particular to FIG. 2, there is illustrated a block diagram of the circuitry for implementing the present invention. The circuitry consists of the phase locked loop 60 of a conventional mobile station consisting of the reference crystal 34, phase detector 28, loop filter 30 and divide-by-N register 36 described previously with respect to FIG. 1. The phase locked loop 60 provides a voltage control signal for tuning an oscillator 95 to a desired frequency. The output of the phase locked loop 60 is connected to a first input 65 of a switch 70. A second input 75 of the switch 70 is connected to a digital to analog converter (DAC) 80. The DAC 80 may be of any type including DACs using Sigma-Delta designs. The switch 70 includes a control input 85 for accepting digital control signals from a controller 90 for moving the switch 70 between the first and second inputs. The output of the switch 70 is connected to a local oscillator 95 and an A/D converter 100. The controller 90 controls the operation of the switch between the first and second positions and the storage of voltage control signal values associated with a particular frequency. The controller bases its control of the switch on 1) whether a previous request for a requested frequency has been made and 2) whether frequency changes are made for the purpose of making power measurements for a neighbor list.

The local oscillator 95 generates a signal at a frequency indicated by the voltage control signal applied to its input necessary for tuning to a desired channel and provides the signal to phase locked loop 60 and to transceiver circuitry 14 as discussed previously in FIG. 1. The A/D converter 100 is connected in parallel with the oscillator and converts the analog control signal provided from the phase locked loop 60 through the switch 70 into a digital signal. The digital signal is stored in a memory 105 associated with the controller 90 at a location associated with the selected frequency.

The present invention works under the premise that it is only necessary to tune the local oscillator frequency to a selected frequency within a predetermined frequency error tolerance when making power measurements. This is because power measurements are noncoherent processes that do not require the frequency to be precise. Thus, the frequency must only be tuned to within the center 25 percent of the IF filter bandwidth. By using previously measured voltage control signal values from the phase locked loop 60, the local oscillator 95 may be more quickly tuned to a desired frequency as described with respect to FIG. 3 without waiting for the proper voltage control signal to be generated by the phased locked loop 60.

Figure 3:
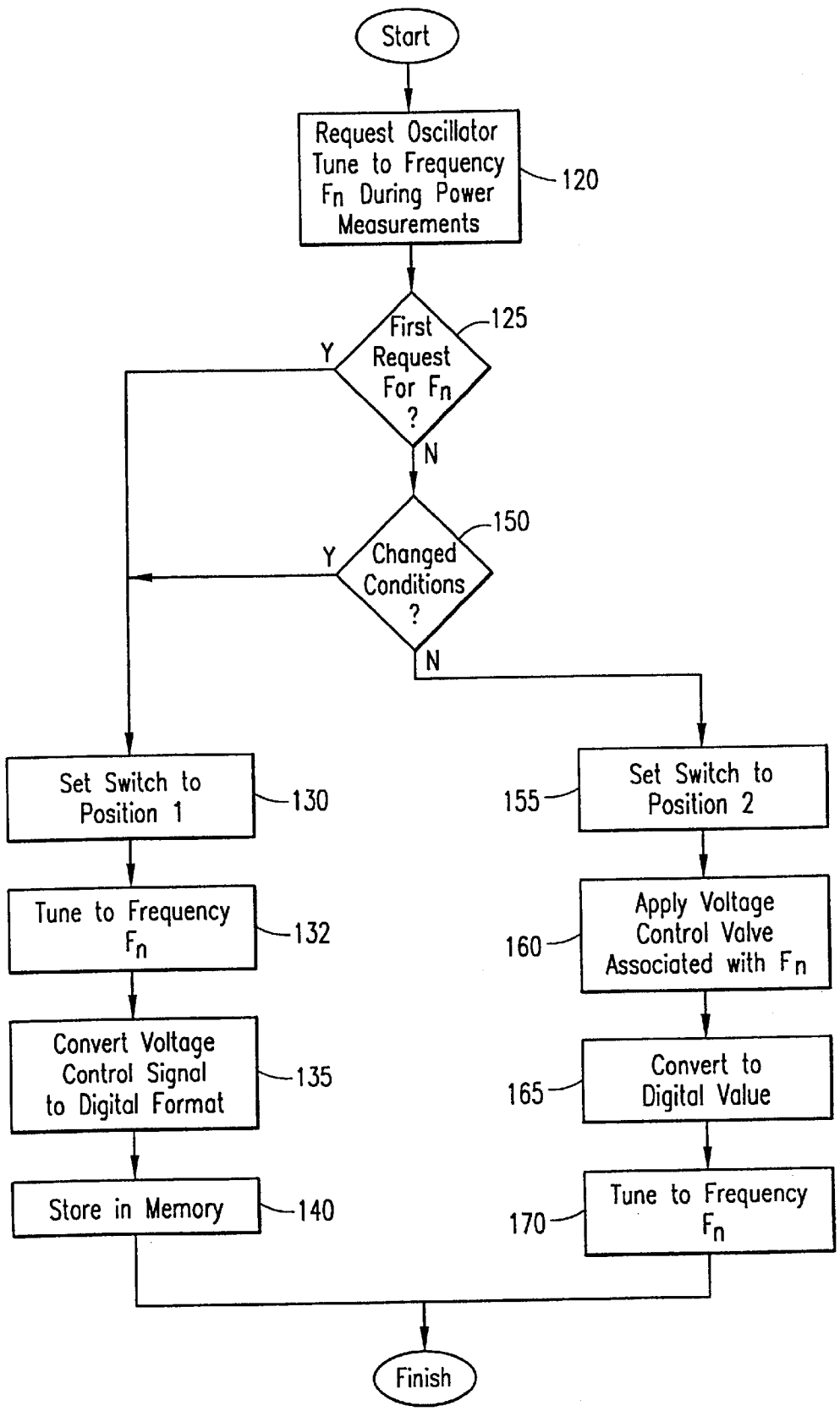
FIG. 3 is a flow diagram describing the operation of the circuitry of the present invention.

Referring now to FIG. 3, in response to receipt of a request at step 120 to tune the local oscillator circuit 95 to a frequency $F_n$ for the purpose of making power measurements, inquiry step 125 determines if this is a first request for the local oscillator to tune to the frequency $F_n$. If this is the first request to tune to frequency $F_n$, the switch 70 is set at step 130 to a first position by controller 90 such that the output of the phase locked loop 65 is connected to the input of the local oscillator circuit 95 through the switch 70 and provides a voltage control signal thereto. The local oscillator 95 is given sufficient time to tune frequency $F_n$ in step 132.

After local oscillator 95 reaches frequency $F_n$, the A/D converter 100, also connected to the output of switch 70, measures the voltage control signal from the phase locked loop 65 and converts it at step 135 to a digital format. This digital representation of the voltage control signal is stored at step 140 within a memory 105 associated with the controller 90 at a location associated with frequency $F_n$. The process is finished for this frequency step.

If inquiry step 125 determines that this is not the first request for frequency $F_n$, inquiry step 150 determines if conditions have changed (i.e., a long period of time has passed, temperature variations, etc.) necessitating the updating of the voltage control signal value associated with $F_n$ in memory 105. If so, control passes to step 130 such that a new voltage control signal value may be stored in memory 105. Otherwise, the switch 70 is set at step 155 to a second position connecting the input of the local oscillator circuit 95 to the output of digital to analog converter 80. The controller 90 provides the voltage control signal value associated with the frequency $F_n$ to a digital to analog converter 80 at step 160 from memory 165, and the digital to analog converter 80 converts the signal to analog form and applies it to the local oscillator circuit 95 via the switch 70 at step 165. The local oscillator 95 tunes at step 170 to the indicated frequency $F_n$. The process is finished for this frequency step.

Figure 4:
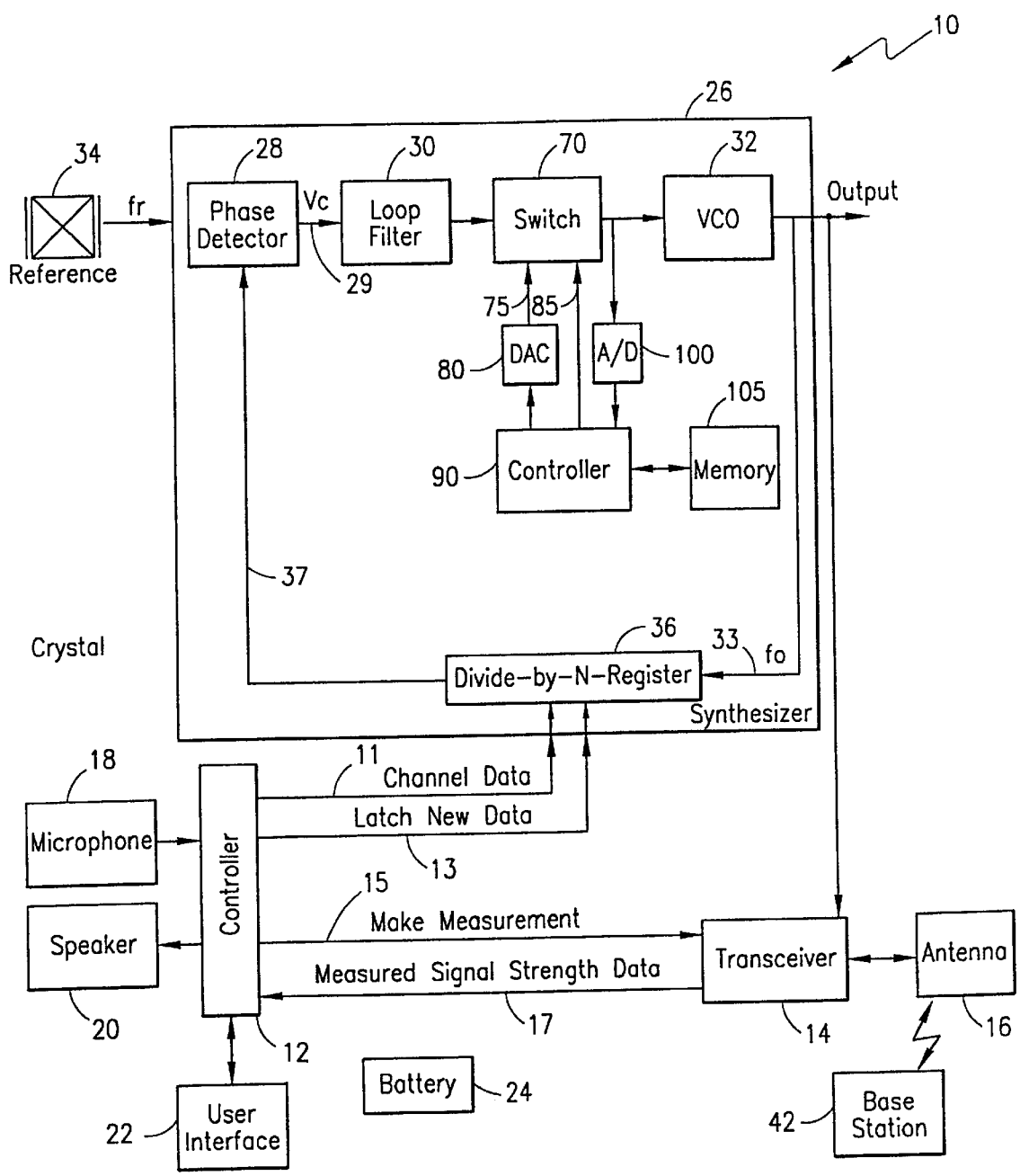
FIG. 4 is a block diagram of a mobile station including the circuitry of FIG. 2.

Referring now to FIG. 4, there is illustrated the circuitry of FIG. 2 inserted within the cellular telephone circuitry described with respect to FIG. 1. As can be seen, all circuitry remains the same except that the switch 70, digital to analog converter 80, A/D converter 100, digital processor 90 and memory 105 are inserted at a point between the loop filter 30 and oscillator 32. Alternatively, the controller 90 and memory 105 may be included within the general controller circuitry 12. It should also be noted that the synthesizer 26 may be of any type (fractional-N, etc.).

Figure 5:
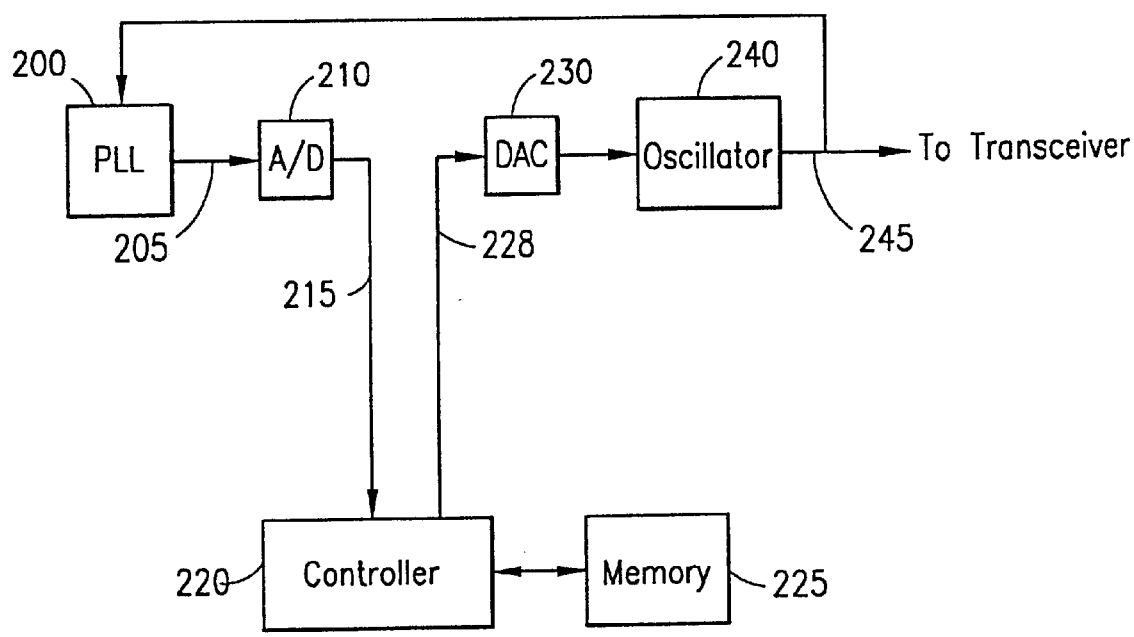
FIG. 5 is a block diagram illustrating an alternative embodiment of the circuitry of the present invent ion.

Referring now to FIG. 5, there is illustrated an alternative embodiment of the circuitry of FIG. 2. In this embodiment, the switching functionality is implemented within the controller 220. Phase locked loop (PLL) 200 provides an analog signal 205 which is applied to the input of A/D converter 210. The A/D converter 210 converts the analog signal 205 from the phase locked loop 200 into a digital signal 215. In a further alternative embodiment, the A/D functionality 210 may be implemented within the output of the phase locked loop 200. The digital signal 215 is applied to an input of the controller 220. If this is the first instance of requesting a selected frequency $F_n$, the digital signal 215 is routed to a D/A converter 230 as digital signal 228. The D/A converter 230 converts digital signal 228 to an analog signal which is applied to oscillator 240. The output signal 245 of oscillator 240 is fed to the transceiver and back to the PLL 200 to complete the synthesizer loop. After stabilization of the synthesizer loop, the controller 220 stores the stabilized value of digital signal 215 within memory 225 at a location associated with the selected frequency $F_n$. If this is not a first request of the selected frequency $F_n$, the digital signal 215 is not applied by the controller 220 to the oscillator 240, and the digital signal 228 applied to the digital to analog converter 230 comes from memory 225 and the location associated with the selected. frequency $F_n$.

Figure 6:
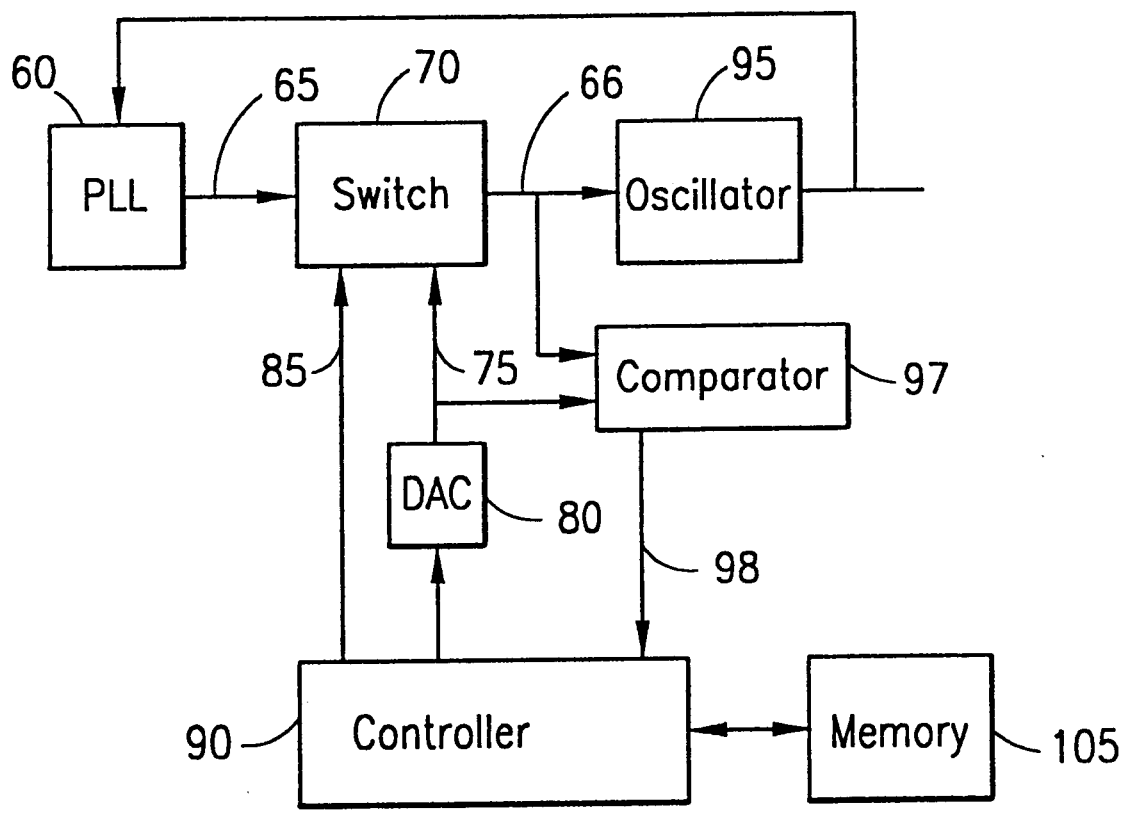
FIG. 6 is a block diagram illustrating yet a further embodiment of the circuitry of the present invention.

Referring now to FIG. 6, there is illustrated an alternative embodiment of the circuitry described in FIG. 2 wherein the A/D converter 100 is replaced with a comparator circuit 97. The comparator has first and second input terminals wherein the first terminal is connected to the output of the switch 70 via Line 66 and the second input is connected to the output of the DAC 80. Upon the occurrence of a first request for a particular frequency $F_n$, controller 90, via a signal on Line 85, sets switch 70 to conduct the signal on Line 65 to Line 66 and open the path from Line 75 to Line 66. The comparator compares the output of switch 66 with the output of DAC 80 once the signal on Line 66 becomes stabilized and notifies the controller 90 of the results of the comparison via Line 98. The controller 90 controls the output of the DAC 80 according to a predetermined routine. If the output from the comparator 97 indicates that the outputs of switch 70 and DAC 80 do not match, a next output signal is provided by the DAC 80 in response to additional instructions from the controller 90. This process continues until the output of the comparator 97 indicates to the controller 90 that the output of switch 70 and the output of DAC 80 match. The data required for the DAC 80 to recreate the matching signal is then stored within memory 105.

While the preselected routine for stepping the DAC 80 through various voltage signals may be of any configuration, in an exemplary embodiment the controller may begin by providing a signal to the DAC designated by the most is significant bit of the control signal provided to the DAC 80 being set to one while the remainder of the bits are set to zero. If the comparator 97 indicates that the output of the DAC 80 is higher than the output of the switch 66, the controller 90 sets the most significant bit to zero and sets the next most significant bit to one. This process continues from most significant to least significant bits until the comparator 70 indicates that the output signal of the DAC 80 is lower than the output of the switch 70. The previously tested bit is then set to 1 and all bits below this, from most significant to least significant, are alternately set to 1 until a determination is made that the output of the DAC 80 is lower than the output of the switch 66. This process continues until the comparator 97 indicates that the output of DAC 80 and switch 70 are within the least significant bit (LSB) of the DAC of each other. The control signal value provided to the DAC 80 to achieve this equality is then stored in memory 105.

Using this system and method a mobile station may more quickly tune an oscillator to a frequency during power measurements of a neighbor list and thus reduce the amount of battery power consumed by the mobile station. The previous description is of a preferred embodiment for implementing the invention, and the scope of the invention should not necessarily be limited by this description. The scope of the present invention is instead defined by the following claims.

What is claimed is:

1. An apparatus for tuning an oscillator to a selected frequency, comprising:

a switch, responsive to a first control signal, having a first position for interconnecting a first input to a voltage control input of the oscillator and having a second position for interconnecting a second input to the voltage control input of the oscillator;

a controller for providing the first control signal to the switch, wherein the first control signal activates the switch to the first position a first time the oscillator tunes to the selected frequency and activates the switch to the second position a next time the oscillator tunes to the selected frequency, the controller further storing a voltage control signal applied to the oscillator the first time the oscillator tunes to the selected frequency and providing a stored voltage control signal to the second input of the switch the next time the oscillator tunes to the selected frequency;

a comparator having a first input connected to an output of the switch and a second input, the comparator further having an output connected to the controller; and a digital to analog converter having an input connected to the controller and an output connected to the second input of the switch and to the second input of the comparator.

2. The apparatus of claim 1, further including a memory associated with the controller for storing the voltage control signal at a location associated with the selected frequency.

3. The apparatus of claim 1, wherein the first input of the switch is connected to a phase locked loop.

4. The apparatus of claim 1, further including:

an analog to digital converter between the output of the switch and the controller for converting the voltage control signal from analog format to digital format; and a digital to analog converter between the second input of the switch and the controller for converting the voltage control signal from digital format to analog format.

5. The apparatus of claim 1, wherein the controller changes the output of the digital to analog converter until the output of the comparator indicates the first and second inputs of the comparator substantially match and stores a control signal provided to the digital to analog converter responsive to this indication.

6. The apparatus of claim 1, wherein the controller places the switch in the second position in response to the next request for the selected frequency only during power measurements for neighbor lists.

7. A mobile station, comprising:
   a phase locked loop circuit for generating a voltage control signal;
   an oscillator for tuning a selected frequency responsive to the voltage control signal;
   a transceiver connected to the oscillator for transceiving on the selected frequency; and
   circuitry connected between an output of the phase locked loop circuit and an input of the oscillator for connecting the output of the phase locked loop circuit to the input of the oscillator responsive to a first request for the selected frequency and for providing a stored voltage control signal to the input of the oscillator responsive to a subsequent request for the selected frequency only during power measurements for neighbor lists.

8. The mobile station of claim 7, wherein the circuitry connected between the output of the phase locked loop circuit and the input of the oscillator, further comprises:
   a switch, responsive to a first control signal, having a first position for interconnecting a first input connected to the phase locked loop circuit to a voltage control input of the oscillator and having a second position for interconnecting a second input to the voltage control input of the oscillator; and
   a controller for providing the first control signal to the switch, wherein the first control signal activates the switch to the first position a first time the oscillator tunes to the selected frequency and activates the switch to the second position a next time the oscillator tunes to the selected frequency, the controller further storing a voltage control signal applied to the oscillator from the phase locked loop the first time the oscillator tunes to the selected frequency and providing a stored voltage control signal to the second input of the switch the next time the oscillator tunes to the selected frequency.

9. The mobile station of claim 8, further including a memory associated with the controller for storing the second control signal at a location associated with the selected frequency.

10. The mobile station of claim 8, further including:
    an analog to digital converter between the output of the switch and the controller for converting the voltage control signal from analog format to digital format; and
    a digital to analog converter between the second input of the switch and the controller for converting the voltage control signal from digital format to analog format.

11. The mobile station of claim 8, wherein the controller places the switch in the second position in response to the next request for the selected frequency only during power measurements for neighbor lists.

12. The mobile station of claim 7, wherein the circuitry connected between the output of the phase locked loop circuit and the input of the oscillator further comprises a controller for interconnecting the output of the phase locked loop to a voltage control input of the oscillator and for storing a control signal applied to the oscillator from the phase locked loop circuit responsive to the first request for the selected frequency, and for providing the stored voltage control signal to the voltage control input of the oscillator responsive to the next request for the selected frequency.

13. A method for tuning an oscillator to a selected frequency, comprising the steps of:
    receiving a request to tune to the selected frequency;
    determining if the request comprises a first request for the selected frequency;
    applying a provided voltage control signal to an oscillator for the first request for the selected frequency;
    storing the provided voltage control signal applied to the oscillator for the first request for the selected frequency;
    applying a previously stored voltage control signal to the oscillator for the selected frequency if the request is not a first request;
    tuning the oscillator to the selected frequency responsive to the applied voltage control signal;
    determining if the request to tune to a selected frequency is responsive to performance of power measurements of a neighbor list; and
    applying the provided voltage control signal to the oscillator if the request is not for the performance of power measurements of a neighbor list.

14. The method of claim 13 wherein the step of saving further comprises the steps of converting the voltage control signal from analog format to digital format.

15. The method of claim 13, further comprising the step of:
    setting a switch connected to the input of the oscillator to a first position if the request comprises a first request and to a second position if the request does not comprise a first request.

16. The method of claim 13, wherein the step of applying a provided voltage control signal, comprises the steps of:
    switching the input of the oscillator to a first input source; and
    applying the provided voltage control signal from the first input source to the oscillator.

17. The method of claim 13, wherein the step of applying a provided voltage control signal comprises the steps of;
    switching the input of the oscillator to a second input source;
    applying the previously stored voltage control signal associated with the selected frequency to the oscillator from the second input source.

18. The method of claim 13, further comprising the step of converting the previously stored voltage control signal from digital format to analog format.

19. The method of claim 13, further including the step of periodically saving a new voltage control signal applied to the oscillator.

20. An apparatus for tuning an oscillator to a selected frequency, comprising:
    a switch, responsive to a first control signal, having a first position for interconnecting a first input to a voltage control input of the oscillator and having a second position for interconnecting a second input to the voltage control input of the oscillator; and
    a controller for providing the first control signal to the switch, wherein the first control signal activates the switch to the first position a first time the oscillator tunes to the selected frequency and activates the switch to the second position a next time the oscillator tunes to the selected frequency, the controller further storing a voltage control signal applied to the oscillator the first time the oscillator tunes to the selected frequency and providing a stored voltage control signal to the second input of the switch the next time the oscillator tunes to the selected frequency;

an analog to digital converter between the output of the switch and the controller for converting the voltage control signal from analog format to digital format; and a digital to analog converter between the second input of the switch and the control for converting the voltage control signal from digital format to analog format.

21. An apparatus for tuning an oscillator to a selected frequency, comprising:

a switch, responsive to a first control signal, having a first position for interconnecting a first input to a voltage control input of the oscillator and having a second position for interconnecting a second input to the voltage control input of the oscillator; and a controller for providing the first control signal to the switch, wherein the first control signal activates the switch to the first position a first time the oscillator tunes to the selected frequency and activates the switch to the second position a next time the oscillator tunes to the selected frequency only during power measurements for neighbor lists, the controller further storing a voltage control signal applied to the oscillator the first time the oscillator tunes to the selected frequency and providing a stored voltage control signal to the second input of the switch the next time the oscillator tunes to the selected frequency.

* * * * *